United States Patent
Huang et al.

(10) Patent No.: US 9,915,702 B2
(45) Date of Patent: Mar. 13, 2018

(54) CHANNEL SHARING FOR TESTING CIRCUITS HAVING NON-IDENTICAL CORES

(71) Applicant: Mentor Graphics Corporation, Wilsonville, OR (US)

(72) Inventors: Yu Huang, Sudbury, MA (US); Mark A. Kassab, Wilsonville, OR (US); Janusz Rajski, West Linn, OR (US); Wu-Tung Cheng, Lake Oswego, OR (US); Jay Babak Jahangiri, Portland, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 14 days.

(21) Appl. No.: 14/554,898

(22) Filed: Nov. 26, 2014

(65) Prior Publication Data

US 2015/0149847 A1    May 28, 2015

Related U.S. Application Data

(60) Provisional application No. 61/908,939, filed on Nov. 26, 2013.

(51) Int. Cl.
*G01R 31/28* (2006.01)
*G01R 31/3183* (2006.01)

(52) U.S. Cl.
CPC .......................... *G01R 31/318335* (2013.01)

(58) Field of Classification Search
CPC ........ G01R 31/318335; G01R 31/2851; G01R 31/2834; G01R 31/31921; G01R 31/31813; G01R 31/318547; G01R 31/318385; G01R 31/318371; G01R 31/31905; G01R 31/318594; G01R 31/318572; G01R 31/318533; G06F 11/267

See application file for complete search history.

(56) References Cited

U.S. PATENT DOCUMENTS

| | | | |
|---|---|---|---|
| 6,327,687 B1 * | 12/2001 | Rajski | G01R 31/318335 714/738 |
| 6,684,358 B1 * | 1/2004 | Rajski | G01R 31/31813 714/728 |
| 7,805,649 B2 | 9/2010 | Rajski et al. | |
| 8,301,945 B2 | 10/2012 | Rajski et al. | |

(Continued)

OTHER PUBLICATIONS

A. R. Pandey and J. H. Patel, "An incremental algorithm for test generation in Illinois scan architecture based designs," Proc. of DATE, pp. 368-375, 2002.

(Continued)

*Primary Examiner* — Guerrier Merant
(74) *Attorney, Agent, or Firm* — Klarquist Sparkman, LLP

(57) ABSTRACT

Various aspects of the disclosed techniques relate to channel sharing techniques for testing circuits having non-identical cores. Compressed test patterns for a plurality of circuit blocks are generated for channel sharing. Each of the plurality of circuit blocks comprises a decompressor configured to decompress the compressed test patterns. Test data input channels are thus shared by the decompressors. Control data input channels are usually not shared by non-identical circuit blocks in the plurality of circuit blocks.

23 Claims, 8 Drawing Sheets

(56) References Cited

U.S. PATENT DOCUMENTS

| | | | | |
|---|---|---|---|---|
| 8,904,256 | B1* | 12/2014 | Chakravadhanula | G01B 31/318547 714/729 |
| 2003/0120988 | A1* | 6/2003 | Rajski | G01R 31/31813 714/726 |
| 2005/0055617 | A1* | 3/2005 | Wang | G01B 31/318335 714/727 |
| 2009/0119559 | A1* | 5/2009 | Foutz | G06F 11/267 714/729 |
| 2011/0099442 | A1* | 4/2011 | Hales | G01R 31/318533 714/729 |
| 2011/0289369 | A1* | 11/2011 | Lee | G01B 31/318547 714/726 |
| 2015/0285854 | A1* | 10/2015 | Kassab | G01R 31/2851 702/58 |

OTHER PUBLICATIONS

K.-J. Lee, J.J. Chen, and C.H. Huang, "Using a Single Input to Support Multiple Scan Chains," Proc. ICCAD, pp. 74-78, 1998.

M.A. Shah and J. H. Patel, "Enhancement of the Illinois scan architecture for use with multiple scan inputs," Proc. of VTS, pp. 167-172, May 2004.

C. Allsup and K. Chung, "Product How to: DFT strategy for ARM processor-based designs," EDN article, Jan. 23, 2013, http://www.edn.com/design/test-and-measurement/4405452/Product-How-To--DFT-strategy-for-ARM-processor-based-designs.

G. Li, J. Qian, P. Li, G. Zuo, "Multi-Level EDT to Reduce Scan Channels in SoC Designs", Proc. ATS, 2012.

* cited by examiner

CHANNEL SHARING FOR TESTING CIRCUITS HAVING NON-IDENTICAL CORES

RELATED APPLICATIONS

This application claims the benefit of U.S. Provisional Patent Application No. 61/908,939, filed on Nov. 26, 2013, and naming Yu Huang et al. as inventors, which application is incorporated entirely herein by reference.

FIELD OF THE DISCLOSED TECHNIQUES

The presently disclosed techniques relates to the field of circuit testing technology. Various implementations of the disclosed techniques may be particularly useful for testing circuits having non-identical circuit blocks.

BACKGROUND OF THE DISCLOSED TECHNIQUES

Nanometer technologies enable manufacturing of very large system-on-chip (SoC) designs that have many cores originating from a variety of sources. One of the main reasons for the growing popularity of SoC designs is the ability to reuse the cores that have been independently designed and verified. Modern multicore SoC architectures have the ability to encapsulate many heterogeneous IP cores running at different clock rates with different power requirements and multiple power-supply voltage levels. Meanwhile, the test constraints at the SoC level, such as the total available test pins, acceptable peak and average test power, DFT layout/routing limit etc, must be satisfied. Many SoC-based test schemes proposed so far utilize dedicated instrumentation including test access mechanisms (TAM) and test wrappers, plus various test pattern scheduling algorithms. TAMs are typically used to transfer test data between the SoC pins and the embedded cores, while test wrappers form the interface between the core and the SoC environment. Test scheduling algorithms are applied to minimize SoC test time. A well-designed TAM and test scheduling can dynamically assign a fraction of the ATE interface capacity to each core. For example, the test pins at different cores could share the same pins at the SoC level in a time-division-multiplexing manner. This allows trade-offs between the test application time, volume of scan test data, test pin count, and interface design complexity.

Meanwhile, scan test compression technologies, such as the Embedded Deterministic Test (EDT), are widely used for logic test of SoCs. Each core usually has its own compression logic developed in isolation from the rest of the design, and the compression can be used for testing the core when it is embedded in the SoC.

In the core-based SoC testing, ATPG (Automatic Test Pattern Generation) is usually performed for each wrapped core, and the core level patterns are mapped to the SoC level, which may be referred to as hierarchical pattern retargeting. Hierarchical pattern retargeting has several benefits compared to running ATPG at the SoC level such as small memory footprint and CPU time and pattern generation without full netlists.

In practice, a SoC may have many cores. Some cores could be large and other cores could be small. Wrapping each small core for hierarchical pattern retargeting may not be an efficient solution. Small cores are often grouped into one unit and one wrapper is inserted around this group of small cores. Under this situation, ATPG has to be run on top of a group of cores inside one wrapper and the generated patterns for this group of cores are mapped to the SoC level. This, called hybrid test flow in this paper, includes ATPG on one or multiple cores followed by hierarchical pattern retargeting.

Running ATPG on a group of cores has its own advantages compared to the hierarchical pattern retargeting on each core in this group: core wrapping is not required; and more optimized pattern counts may be obtained due to ATPG native static and dynamic compaction on a bigger set of fault population. Even in a large core without any embedded cores, it is possible to have multiple modules/blocks, each of which has its own compression logic. Modular compression logic is primarily used in two situations: 1) To reduce routing overhead by using local compression logic rather than global compression logic; and 2) If a core has multiple power domains, each power domain may have its own compression logic to minimize the number of signals crossing power domain boundaries, reducing the number of power isolation cells and/or level shifters. In this disclosure, the term "circuit block" is used to represent a part of a circuit that has its own test compression logic. A circuit block may be a core or a part of a core.

The limited number of input/output channels for test stimuli and test response data remains as a constraint for running ATPG on a group of circuit blocks. Identical circuit block instances can share input channels for scan stimuli. It is the increasing number of non-identical circuit blocks that creates the bottleneck and limits the bandwidth that can be provided to each circuit blocks. Because the number of test input channels is very limited for a circuit block, its effective compression ratio may drop due to insufficient encoding capacity. It is thus desirable to develop techniques for testing circuits having non-identical circuit blocks based on channel sharing.

BRIEF SUMMARY OF THE DISCLOSED TECHNIQUES

Various aspects of the disclosed techniques relate to channel sharing techniques for testing circuits having non-identical cores. In one aspect, there is a method, executed by at least one processor of a computer, comprising: generating compressed test patterns for a plurality of circuit blocks, wherein the plurality of circuit blocks are components of a circuit design, each of the plurality of circuit blocks comprises a decompressor configured to decompress the compressed test patterns and a compactor configured to compact test response data, and the generating comprises determining control data for each of non-identical circuit blocks in the plurality of circuit blocks; and storing the compressed test patterns and the control data.

The decompressor may be a linear finite-state machine. The control data for each of non-identical circuit blocks in the plurality of circuit blocks may comprise mask control bits for the compactor in the each of non-identical circuit blocks in the plurality of circuit blocks. The control data may further comprise low power control bits. Some circuit blocks in the plurality of circuit blocks may belong to an IP (intellectual property) core.

The method may further comprise: shifting the compressed test patterns into the decompressors in the plurality of circuit blocks through shared test data-only input channels; and shifting the control data into registers in each of non-identical circuit blocks in the plurality of circuit blocks through control data input channels, the non-identical circuit blocks using different control data input channels. If there are multiple instances of a circuit block, these instances may share the same data input channel(s).

In another aspect, there are one or more non-transitory computer-readable media storing computer-executable instructions for causing one or more processors to perform a method, the method comprising: generating compressed test patterns for a plurality of circuit blocks, wherein the plurality of circuit blocks are components of a circuit design, each of the plurality of circuit blocks comprises a decompressor configured to decompress the compressed test patterns and a compactor configured to compact test response data, and the generating comprises determining control data for each of non-identical circuit blocks in the plurality of circuit blocks; and storing the compressed test patterns and the control data.

In still another aspect, there is an integrated circuit, comprising: a plurality of circuit blocks, wherein each of the plurality of circuit blocks comprises: a decompressor configured to decompress compressed test patterns, and a compactor configured to compact test response data; first input channels for shifting in only compressed test patterns, wherein the first input channels are shared by the decompressors in the plurality of circuit blocks and the compressed test patterns are generated for the plurality of circuit blocks; and second input channels for shifting in control data, wherein different non-identical circuit blocks in the plurality of circuit blocks are connected to different input channels in the second input channels.

Identical circuit blocks in the plurality of circuit blocks may share input channels in the second input channels. Some circuit blocks in the plurality of circuit blocks may belong to an IP (intellectual property) core. The decompressor may be a linear finite-state machine. The control data for each of non-identical circuit blocks in the plurality of circuit blocks may comprise mask control bits for the compactor in the each of non-identical circuit blocks in the plurality of circuit blocks.

In still another aspect, there are one or more non-transitory computer-readable media storing computer-executable instructions for causing one or more processors to create or to modify a design of an integrated circuit, the integrated circuit comprising: a plurality of circuit blocks, wherein each of the plurality of circuit blocks comprises: a decompressor configured to decompress compressed test patterns, and a compactor configured to compact test response data; first input channels for shifting in only compressed test patterns, wherein the first input channels are shared by the decompressors in the plurality of circuit blocks and the compressed test patterns are generated for the plurality of circuit blocks; and second input channels for shifting in control data, wherein different non-identical circuit blocks in the plurality of circuit blocks are connected to different input channels in the second input channels.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclose techniques. Thus, for example, those skilled in the art will recognize that the disclose techniques may be embodied or carried out in a manner that achieves or optimizes one advantage or group of advantages as taught herein without necessarily achieving other objects or advantages as may be taught or suggested herein.

DETAILED DESCRIPTION OF THE DISCLOSED TECHNIQUES

Various aspects of the disclosed techniques relate to channel sharing techniques for testing circuits having non-identical cores. In the following description, numerous details are set forth for the purpose of explanation. However, one of ordinary skill in the art will realize that the disclosed techniques may be practiced without the use of these specific details. In other instances, well-known features have not been described in details to avoid obscuring the presently disclosed techniques.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

The detailed description of a method or a device sometimes uses terms like "determine" and "generate" to describe the disclosed method or the device function/structure. Such terms are high-level abstractions. The actual operations or functions/structures that correspond to these terms will vary depending on the particular implementation and are readily discernible by one of ordinary skill in the art. It should also be appreciated by one of ordinary skill in the art that the term "coupled" means "connected directly or indirectly."

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods.

Figure 1:
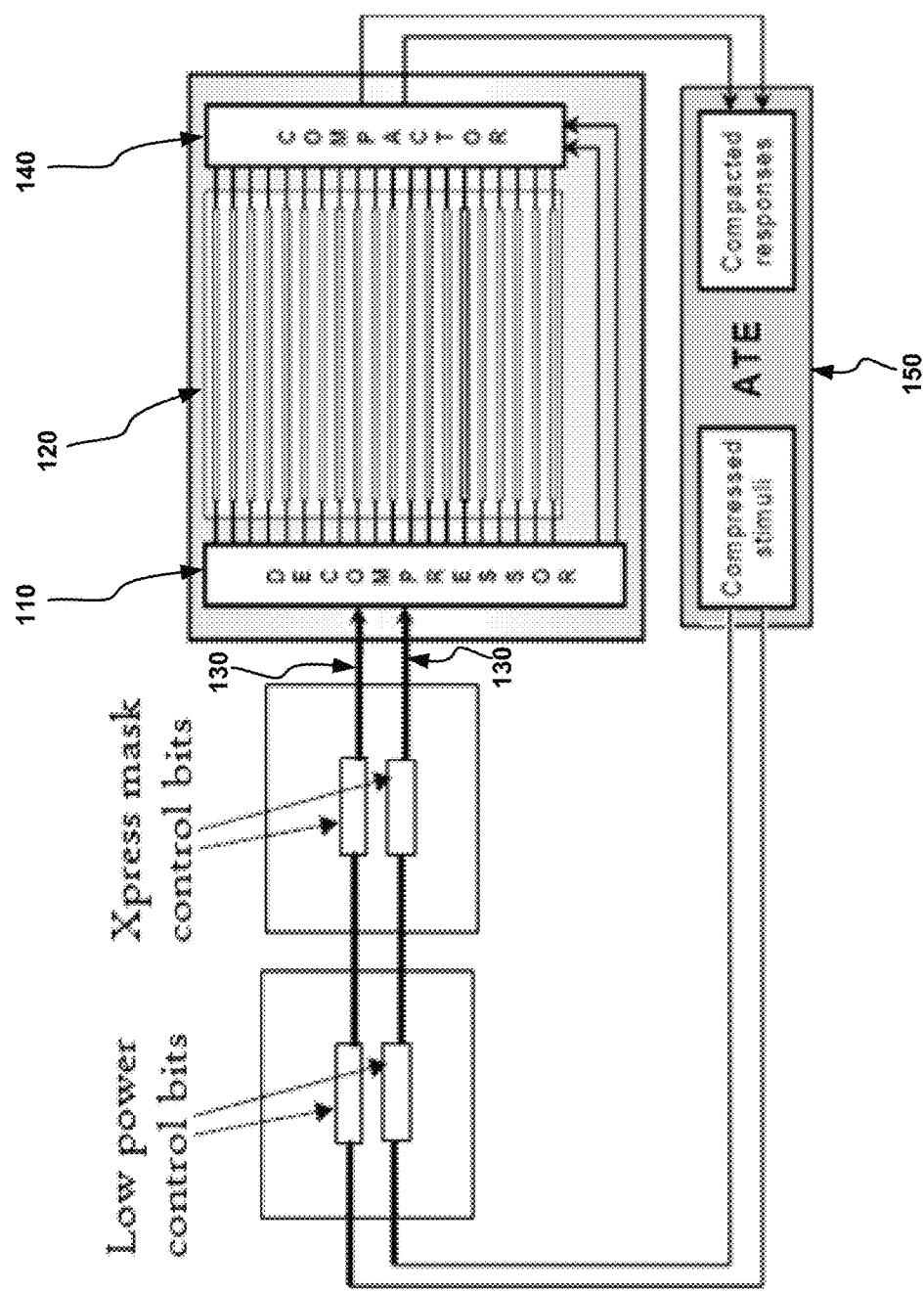
FIG. 1 illustrates an example of the conventional EDT hardware.

EDT is used as an example to describe the disclosed techniques. It should be appreciated, however, that the disclosed techniques can be applied to different test compression schemes. The EDT-based compression is composed of two complimentary parts—hardware that is embedded on chip, and deterministic ATPG software that generates compressed patterns that utilize the embedded hardware. FIG. 1 illustrates an example of the conventional EDT hardware inserted along the scan paths. The EDT hardware comprises a continuous-flow decompressor 110 that feeds test stimuli to a large number of internal scan chains 120 from a small number of input channels 130, and a compactor 140 that compacts test responses from the internal scan chains to the scan channel outputs. A tester 150 supplies test stimuli to and collects test responses from the EDT hardware. Additional details concerning EDT-based compression and decompression are found in J. Rajski, J. Tyszer, M. Kassab, and N. Mukherjee, "Embedded deterministic test," *IEEE Trans. CAD*, vol. 23, pp. 776-792, May 2004, and U.S. Pat. Nos. 6,327,687; 6,353,842; 6,539,409; 6,543,020; 6,557,129; 6,684,358; 6,708,192; 6,829,740; 6,874,109; 7,093,175; 7,111,209; 7,260,591; 7,263,641; 7,478,296; 7,493,540; 7,500,163; 7,506,232; 7,509,546; 7,523,372; 7,653,851, all of which are hereby incorporated herein by reference.

A widely used EDT compactor is called Xpress compactor. The Xpress compactor provides an efficient way to deal with so-called "X-states" that can arise during test by using test data selection circuitry operated based on control bits. The control bits come from the external input channels. Details concerning the Xpress compactor can be found in U.S. Pat. No. 7,805,649, which is incorporated herein by reference. To addition to the Xpress Compactor, a low power controller may be included in the EDT hardware to control the shift power. The low power controller is controlled by some bits from the external input channels as well. Details concerning the low power controller can be found in U.S. Pat. No. 8,301,945, which is incorporated herein by reference. FIG. 1 shows a conventional approach how the control bits for both the Xpress compactor and the low power controller are shifted in. In this simplified example, two EDT input channels drive the decompressor 110, and the control bits for Xpress compactor and low power controller are evenly distributed among these two channels. The shift cycle length of each pattern would be ($L_{Control}+L_{Max\_Chain}$), where $L_{Control}$ is the total number of control bits (including both Xpress control bits and low power control bits) and $L_{Max\_Chain}$ is the length of the longest internal scan chain.

Figure 2:
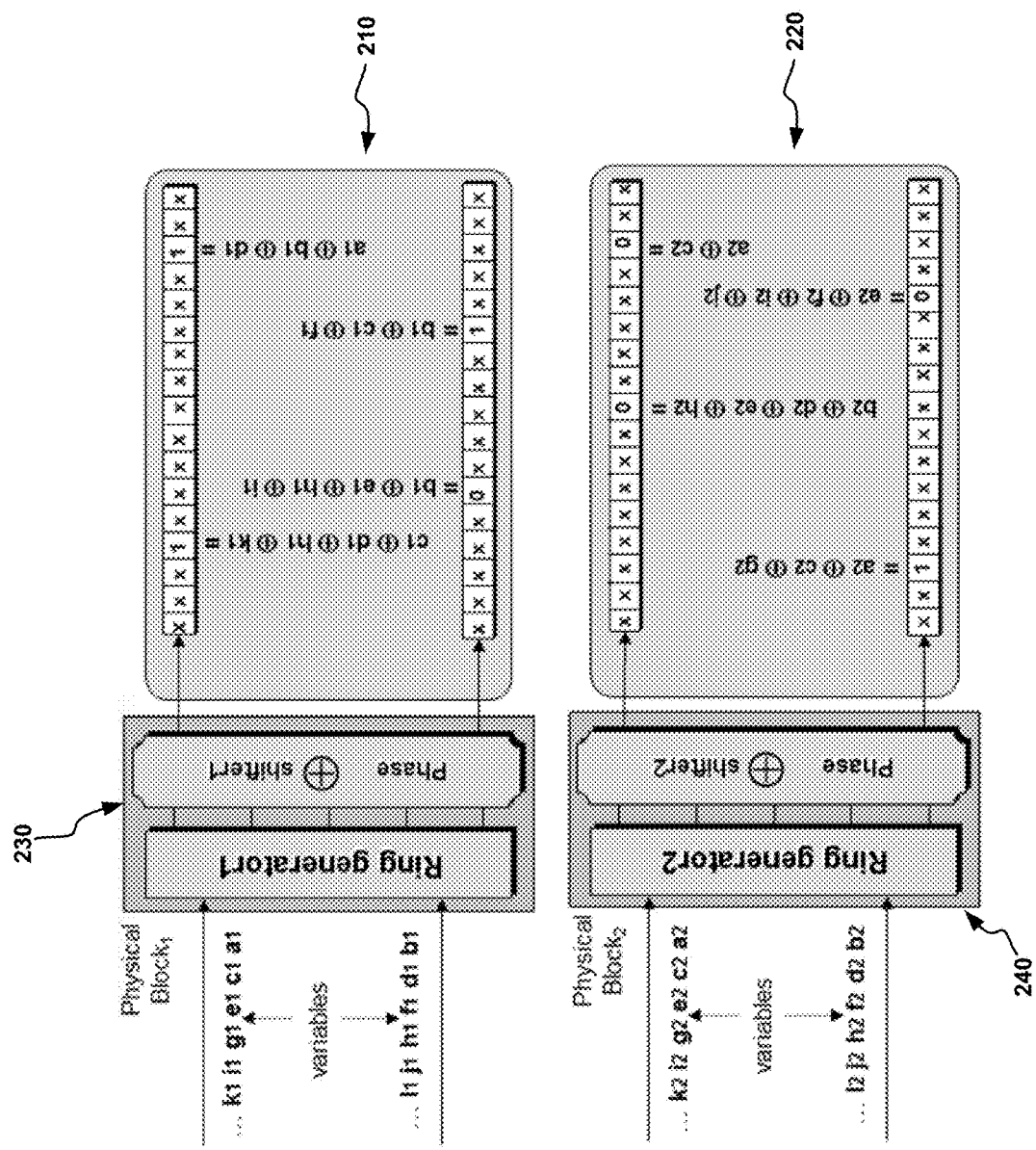
FIG. 2 illustrates an example of two circuit blocks, each of which comprises a decompressor.
Figure 3:
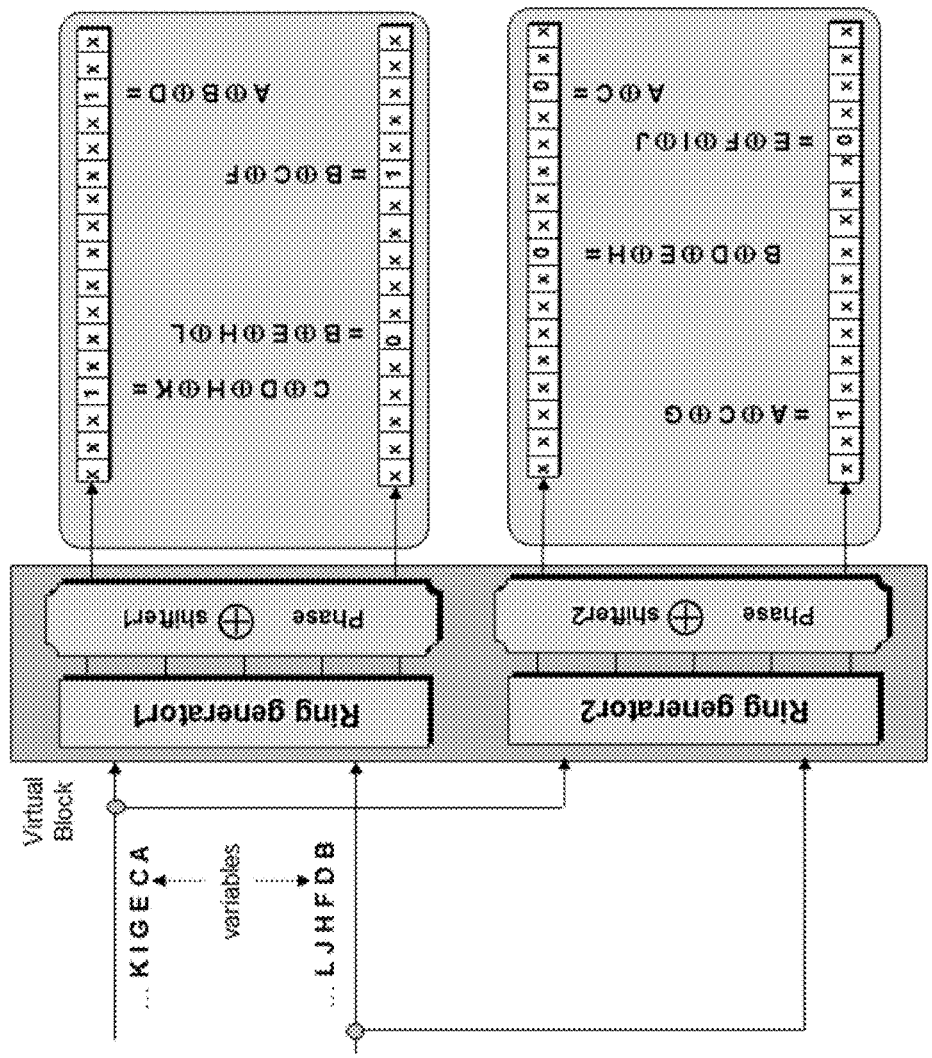
FIG. 3 illustrates how an EDT solver treats the two circuit blocks in FIG. 2 as a single virtual block when compressing test patterns during ATPG.

The EDT compression of test cubes is performed by treating the external test data as Boolean variables. Scan cells are conceptually filled with symbolic expressions that are linear functions of input variables injected into the decompressor. In the case of a decompressor comprising a ring generator and an associated phase shifter, a set of linear equations corresponding to scan cells whose values are specified may be used. A compressed pattern can be determined by solving the system of equations. If the compressed pattern determined as such is then scanned in through the decompressor, the bits that were specified by ATPG will be generated accordingly. Unspecified bits are set to pseudo-random values based on the decompressor architecture. FIG. 2 illustrates an example of two circuit blocks 210 and 220, each of which comprises a decompressor (230 and 240, respectively). Two sets of linear equations for the two decompressors are also illustrated in FIG. 3. For the decompressor 230, the equations are:

$a_1 \oplus b_1 \oplus d_1 = 1$ $b_1 \oplus c_1 \oplus f_1 = 1$ $b_1 \oplus e_1 \oplus h_1 \oplus l_1 = 0$ $c_1 \oplus d_1 \oplus h_1 \oplus k_1 = 1$ For the decompressor 240, the equations are:

$a_2 \oplus c_2 = 0$ $e_2 \oplus f_2 \oplus i_2 \oplus j_2 = 0$ $b_2 \oplus d_2 \oplus e_2 \oplus h_2 = 0$ $a_2 \oplus e_2 \oplus g_2 = 1$ The disclosed techniques are based on test data channel sharing. For test data channel sharing, rather than solving the above two sets of equations one physical block at a time, the equations from different circuit blocks are solved in parallel. These two sets of equations becomes:

$A \oplus B \oplus D = 1$ $B \oplus C \oplus F = 1$ $B \oplus E \oplus H \oplus L = 0$ $C \oplus D \oplus H \oplus K = 1$ $A \oplus C = 0$ $E \oplus F \oplus I \oplus J = 0$ $B \oplus D \oplus E \oplus H = 0$ $A \oplus C \oplus G = 1$ This combined set of equations may be treated as a set of equations for a single EDT block when compressing patterns during ATPG, as illustrated in FIG. 3. From the EDT solver's point of view, it builds linear equations corresponding to scan cells whose values are specified in non-identical circuit blocks within this virtual block, and solves these equations simultaneously. This virtual view approach may lead to an optimal distribution of encoding capacity among physical blocks and thus an improvement on the encoding efficiency and compression ratio.

Figure 5:
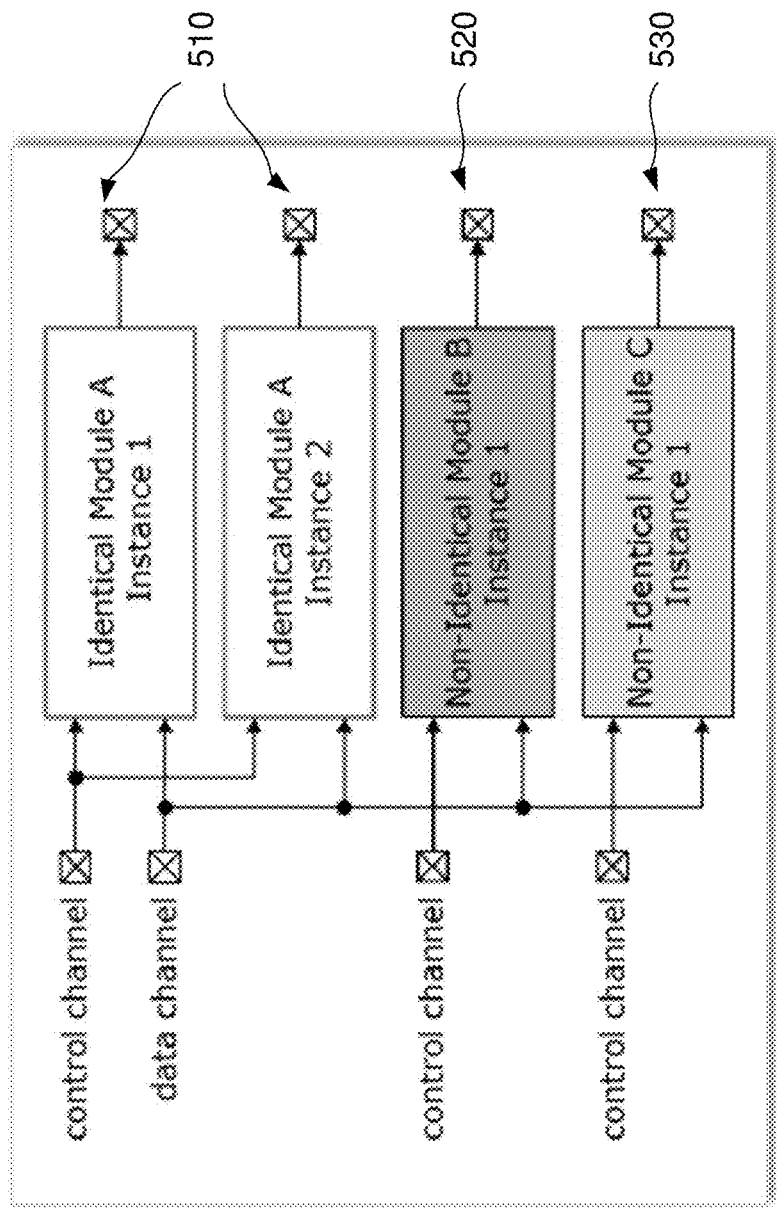
FIG. 5 illustrates an example of applying channel sharing techniques to a circuit design having identical and non-identical circuit blocks.

While the two non-identical blocks shown in FIGS. 2-3 are used as an example to explain how compressed test patterns are generated for channel sharing, the disclosed techniques can be applied to various circuit designs that comprise more than two non-identical circuit blocks. In FIG. 5, for example, the circuit design has three non-identical circuit blocks 510, 520 and 530. Among them the circuit block 510 has two instances. The virtual block for the EDT solver includes three circuit blocks: one instance of the circuit block 510 and the circuit blocks 520 and 530.

Figure 6A:
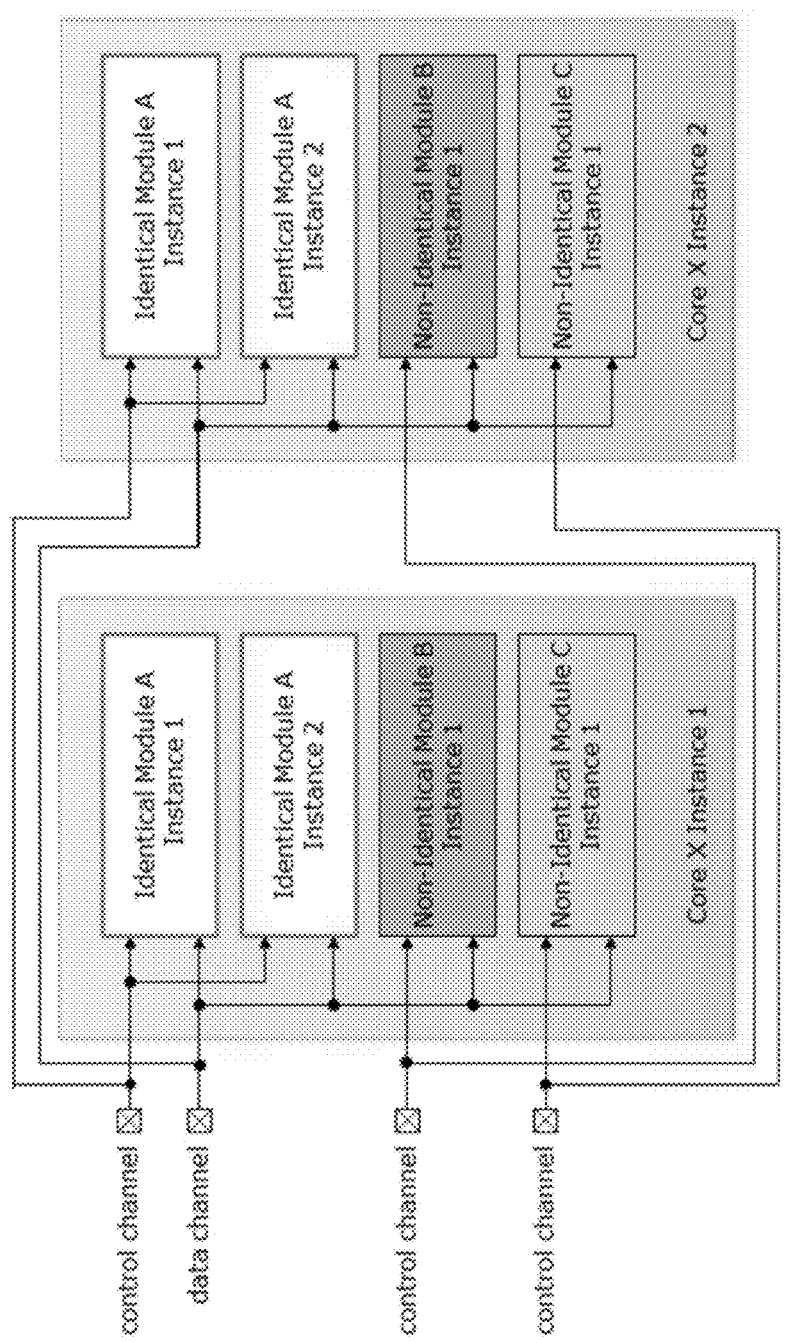
FIG. 6A illustrates an example of applying channel sharing techniques to a circuit design that has two instances of the IP core shown in FIG. 5.

FIG. 6A illustrates an example of a circuit design that has two instances of an IP (intellectual property) core, wherein the IP core is the same circuit as shown in FIG. 5. The data channels are shared by all the circuit blocks inside the IP core. ATPG may be performed at the top level or at the IP core level.

Figure 6B:
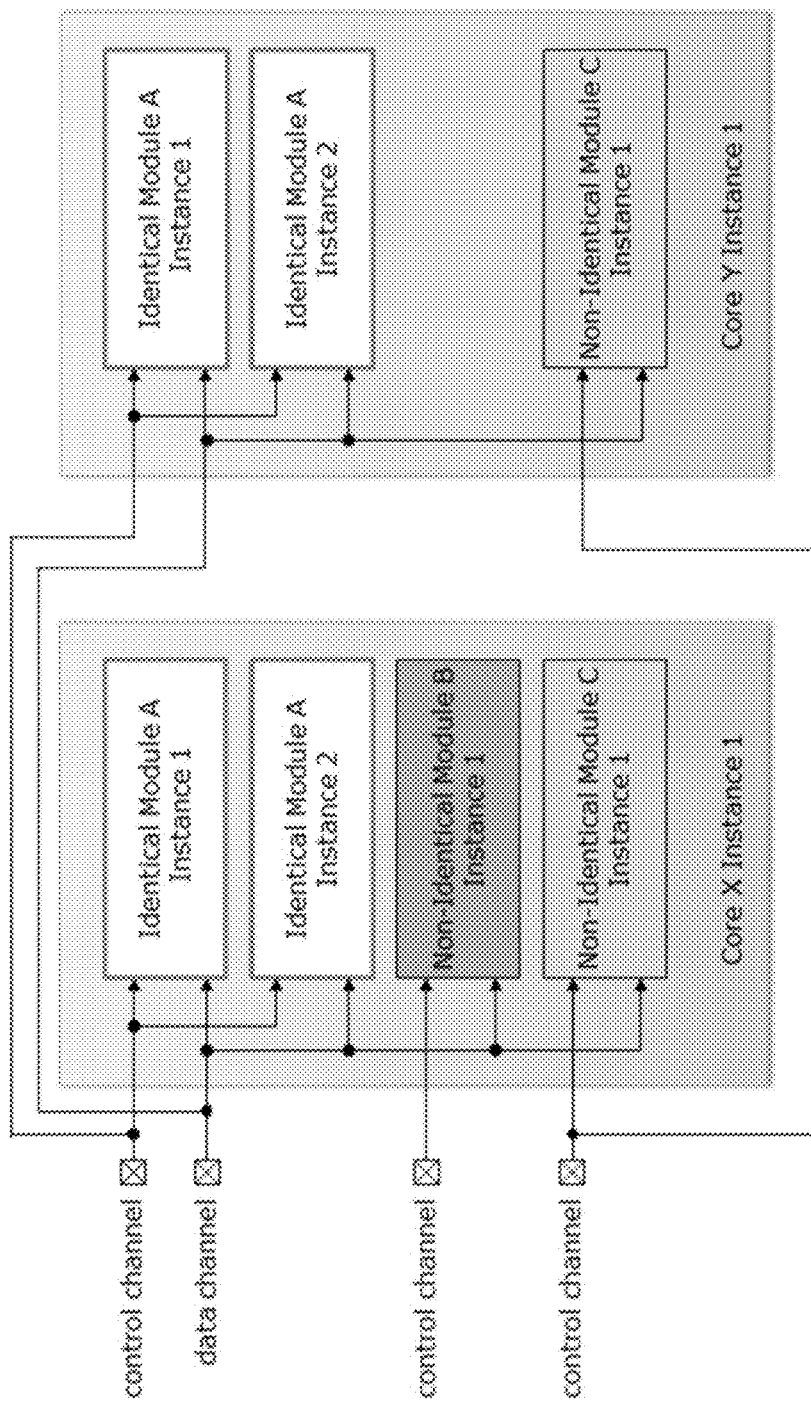
FIG. 6B illustrates an example of applying channel sharing techniques to a circuit design that has two different IP cores.

FIG. 6B illustrates an example of a circuit design that has two different IP cores, wherein one of the IP cores is the same circuit as shown in FIG. 5. In this case, ATPG may need to be performed at the top level.

Figure 4:
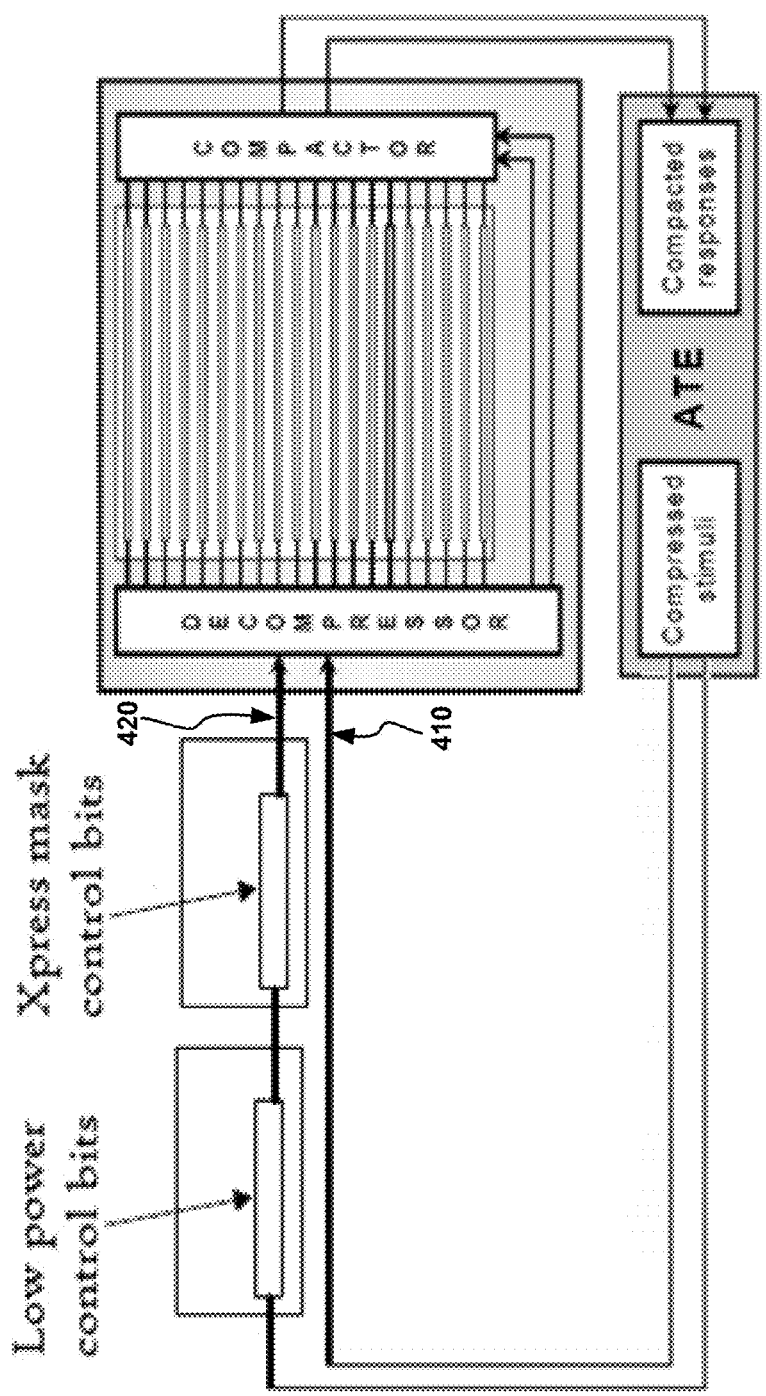
FIG. 4 illustrates an example of using a separate input channel for shifting control data.

The control data such as mask control bits for the compactor (e.g., Xpress compactor) and low power control bits for the low power controller are determined during ATPG without encoding. Different circuit blocks usually have different control data and cannot share control data input channels. This is because different circuit blocks may require different compactors and/or different low power settings even for the same pattern. To accommodate this requirement, different input channels are used for the control data and test data. The conventional data loading scheme as illustrated in FIG. 1 needs to be changed for the channel sharing. An example is illustrated in FIG. 4. In the figure, input channel 410 is referred to as test data-only input channel because only test data are delivered through, and input channel 420 is referred to as control data input channel.

Unlike test data-only input channels, control data input channels may be used for shifting in a portion of test data in some situations along with the control data. If $L_{Control} < L_{Max\_Chain}$, for example, some test data may be shifted in through the control data input channel during the first $(L_{Max\_Chain} - L_{Control})$ and then control data are shifted in during the remaining $L_{Control}$ cycles while the test data-only input channel is still used to deliver test data during the $L_{Max\_Chain}$ cycles. In case $L_{Control} > L_{Max\_Chain}$, the control bits may be delivered through the first n input channels, where $n = \text{ceil}(\Sigma(L_{Control})/L_{Max\_Chain})$. If the last control channel is shorter than $L_{Max\_Chain}$, the first $(L_{Max\_Chain} - L_{Control})$ cycles can still be used to deliver test data on the last control channel as well.

Figure 7:
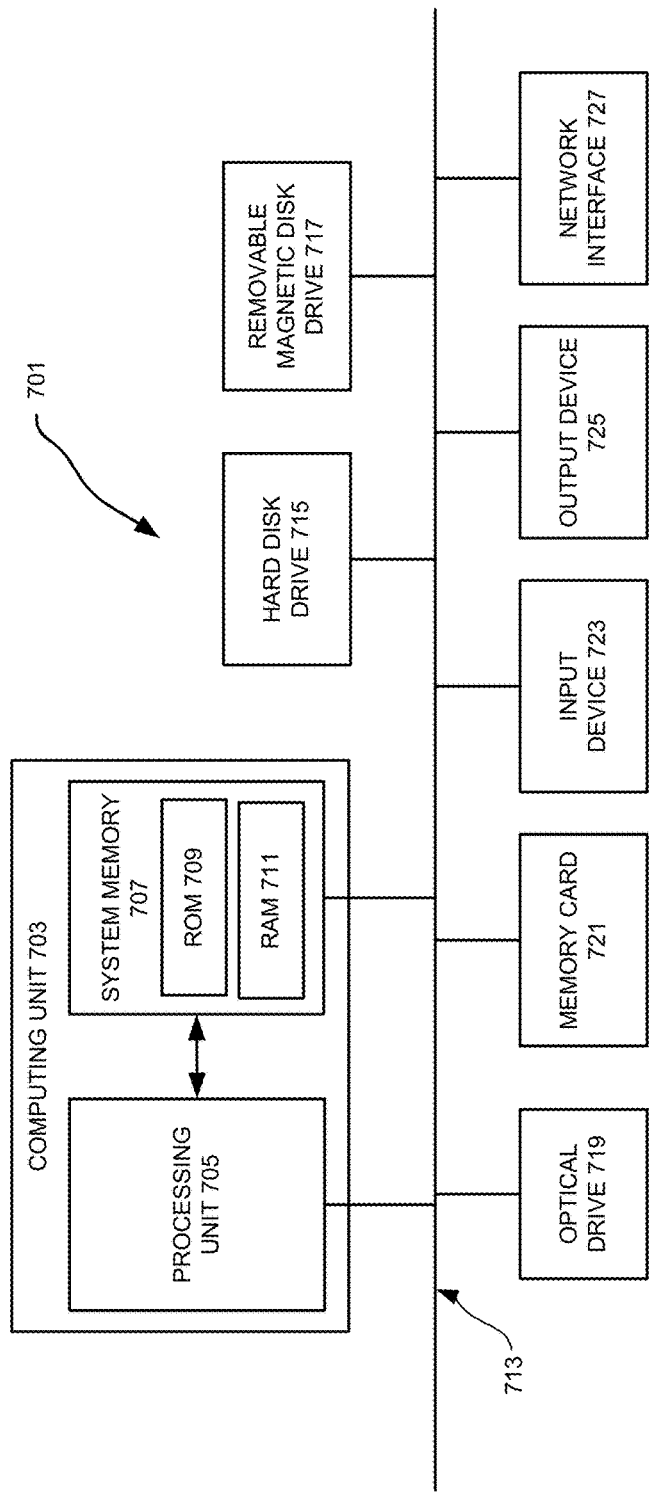
FIG. 7 illustrates a programmable computer system with which various embodiments of the disclosed techniques may be employed.

Various embodiments of the disclosed techniques related to, e.g., compressed test pattern generation and test circuitry insertion may be implemented through the execution of software instructions by a computing device, such as a programmable computer. FIG. 7 shows an illustrative example of such a programmable computer (a computing device 701). As seen in this figure, the computing device 701 includes a computing unit 703 with a processing unit 705 and a system memory 707. The processing unit 705 may be any type of programmable electronic device for executing software instructions, but will conventionally be a microprocessor. The system memory 707 may include both a read-only memory (ROM) 709 and a random access memory (RAM) 711. As will be appreciated by those of ordinary skill in the art, both the read-only memory (ROM) 709 and the random access memory (RAM) 711 may store software instructions for execution by the processing unit 705.

The processing unit 705 and the system memory 707 are connected, either directly or indirectly, through a bus 713 or alternate communication structure, to one or more peripheral devices. For example, the processing unit 705 or the system memory 707 may be directly or indirectly connected to one or more additional memory storage devices, such as a "hard" magnetic disk drive 715, a removable magnetic disk drive 717, an optical disk drive 719, or a flash memory card 721. The processing unit 705 and the system memory 707 also may be directly or indirectly connected to one or more input devices 723 and one or more output devices 725. The input devices 723 may include, for example, a keyboard, a pointing device (such as a mouse, touchpad, stylus, trackball, or joystick), a scanner, a camera, and a microphone. The output devices 725 may include, for example, a monitor display, a printer and speakers. With various examples of the computer 701, one or more of the peripheral devices 715-725 may be internally housed with the computing unit 703. Alternately, one or more of the peripheral devices 715-725 may be external to the housing for the computing unit 703 and connected to the bus 713 through, for example, a Universal Serial Bus (USB) connection.

With some implementations, the computing unit 703 may be directly or indirectly connected to one or more network interfaces 727 for communicating with other devices making up a network. The network interface 727 translates data and control signals from the computing unit 703 into network messages according to one or more communication protocols, such as the transmission control protocol (TCP) and the Internet protocol (IP). Also, the interface 727 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 701 is illustrated as an example only, and it not intended to be limiting. Various embodiments of the disclosed techniques may be implemented using one or more computing devices that include the components of the computer 701 illustrated in FIG. 7, which include only a subset of the components illustrated in FIG. 7, or which include an alternate combination of components, including components that are not shown in FIG. 7. For example, various embodiments of the disclosed techniques may be implemented using a multi-processor computer, a plurality of single and/or multiprocessor computers arranged into a network, or some combination of both.

Some other embodiments of the disclosed techniques may be implemented by software instructions, stored on one or more non-transitory computer-readable media, for causing one or more processors to create a design of the integrated circuit such as the one shown in FIG. 1. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, a "punched" surface type device, or a solid state storage device.

CONCLUSION

While the disclosed techniques has been described with respect to specific examples including presently preferred modes of carrying out the disclosed techniques, those skilled in the art will appreciate that there are numerous variations and permutations of the above described systems and techniques that fall within the spirit and scope of the disclosed techniques as set forth in the appended claims. For example, while specific terminology has been employed above to refer to electronic design automation processes, it should be appreciated that various examples of the disclosed techniques may be implemented using any desired combination of electronic design automation processes.

What is claimed is:

1. A method, executed by at least one processor of a computer, comprising:

generating compressed test patterns for a plurality of circuit blocks comprising identical and non-identical circuit blocks, wherein the plurality of circuit blocks are components of a circuit design, each of the plurality of circuit blocks comprises a decompressor configured to decompress the compressed test patterns and a compactor configured to compact test response data, and the generating comprises determining control data for each of non-identical circuit blocks in the plurality of circuit blocks, the control data further being for control data input channels that are respectively dedicated to each of the non-identical circuit blocks and that are separate and different from each other, wherein a plurality of the identical circuit blocks in the plurality of circuit blocks share the same control data input channel; and storing the compressed test patterns and the control data.

2. The method recited in claim 1, wherein the control data for each of non-identical circuit blocks in the plurality of circuit blocks comprise mask control bits for the compactor in the each of non-identical circuit blocks in the plurality of circuit blocks.

3. The method recited in claim 1, wherein one or more of the non-identical circuit blocks have multiple instances.

4. The method recited in claim 1, wherein some circuit blocks in the plurality of circuit blocks belong to an IP (intellectual property) core.

5. The method recited in claim 1, further comprising:
shifting the compressed test patterns into the decompressors in the plurality of circuit blocks through shared test data-only input channels; and
shifting the control data into registers in each of non-identical circuit blocks in the plurality of circuit blocks through the control data input channels, the non-identical circuit blocks using different control data input channels.

6. The method recited in claim 5, wherein the plurality of identical circuit blocks in the plurality of circuit blocks comprises a first set of identical circuit blocks that use a first control data input channel, and wherein a second set of identical circuit blocks use a second control data input channel that is different from the first control data input channel.

7. The method recited in claim 1, wherein the decompressor is a linear finite-state machine.

8. One or more non-transitory computer-readable media storing computer-executable instructions for causing one or more processors to perform a method, the method comprising:
generating compressed test patterns for a plurality of circuit blocks comprising identical and non-identical circuit blocks, wherein the plurality of circuit blocks are components of a circuit design, each of the plurality of circuit blocks has a decompressor configured to decompress the compressed test patterns and a compactor configured to compact test response data, and the generating comprises determining control data for each of non-identical circuit blocks in the plurality of circuit blocks, the control data further being for control data input channels that are respectively dedicated to each of the non-identical circuit blocks and that are separate and different from each other, wherein a plurality of the identical circuit blocks in the plurality of circuit blocks uses the same control data input channel; and storing the compressed test patterns and the control data.

9. The one or more non-transitory computer-readable media recited in claim 8, wherein the control data for each of non-identical circuit blocks in the plurality of circuit blocks comprise mask control bits for the compactor in the each of non-identical circuit blocks in the plurality of circuit blocks.

10. The one or more non-transitory computer-readable media recited in claim 8, wherein some circuit blocks in the plurality of circuit blocks belong to an IP (intellectual property) core.

11. The one or more non-transitory computer-readable media recited in claim 8, wherein the method further comprises:
shifting the compressed test patterns into the decompressors in the plurality of circuit blocks through shared test data-only input channels; and
shifting the control data into registers in each of non-identical circuit blocks in the plurality of circuit blocks through the control data input channels, the non-identical circuit blocks using different control data input channels.

12. The one or more non-transitory computer-readable media recited in claim 11, wherein the plurality of identical circuit blocks in the plurality of circuit blocks comprises a first set of identical circuit blocks that shares a first control data input channel for the control data, and wherein a second set of identical circuit blocks in the plurality of circuit blocks shares a second control data input channel for the control data that is different from the first control data input channel.

13. The one or more non-transitory computer-readable media recited in claim 8, wherein the decompressor is a linear finite-state machine.

14. An integrated circuit, comprising:
a plurality of circuit blocks comprising identical and non-identical circuit blocks, wherein each of the plurality of circuit blocks comprises:
a decompressor configured to decompress compressed test patterns, and
a compactor configured to compact test response data;
first input channels for shifting in only compressed test patterns, wherein the first input channels are shared by the decompressors in the plurality of circuit blocks and the compressed test patterns are generated for the plurality of circuit blocks; and
second input channels for shifting in control data, wherein different non-identical circuit blocks in the plurality of circuit blocks are connected to separate and different ones of the input channels from among the second input channels, and wherein identical circuit blocks in the plurality of circuit blocks share input channels in the second input channels.

15. The integrated circuit recited in claim 14, wherein the plurality of identical circuit blocks in the plurality of circuit blocks comprises a first set of identical circuit blocks that uses a first control data input channel, and wherein a second set of identical circuit blocks uses a second control data input channel that is different from the first control data input channel.

16. The integrated circuit recited in claim 14, wherein some circuit blocks in the plurality of circuit blocks belong to an IP (intellectual property) core.

17. The integrated circuit recited in claim 14, wherein the decompressor is a linear finite-state machine.

18. The integrated circuit recited in claim 14, wherein the control data for each of non-identical circuit blocks in the plurality of circuit blocks comprise mask control bits for the compactor in the each of non-identical circuit blocks in the plurality of circuit blocks.

19. One or more non-transitory computer-readable media storing computer-executable instructions for causing one or more processors to create or to modify a design of an integrated circuit, the integrated circuit comprising:
a plurality of circuit blocks comprising identical and non-identical circuit blocks, wherein each of the plurality of circuit blocks comprises:
a decompressor configured to decompress compressed test patterns, and a compactor configured to compact test response data;

first input channels for shifting in only compressed test patterns, wherein the first input channels are shared by the decompressors in the plurality of circuit blocks and the compressed test patterns are generated for the plurality of circuit blocks; and second input channels for shifting in control data, wherein different non-identical circuit blocks in the plurality of circuit blocks are connected to separate and different ones of the input channels from among the second input channels, and wherein identical circuit blocks in the plurality of circuit blocks share input channels in the second input channels.

20. The one or more non-transitory computer-readable media recited in claim 19, wherein the plurality of identical circuit blocks in the plurality of circuit blocks comprises a first set of identical circuit blocks that uses a first control data input channel, and wherein a second set of identical circuit blocks uses a second control data input channel that is different from the first control data input channel.

21. The one or more non-transitory computer-readable media recited in claim 19, wherein some circuit blocks in the plurality of circuit blocks belong to an IP (intellectual property) core.

22. The one or more non-transitory computer-readable media recited in claim 19, wherein the decompressor is a linear finite-state machine.

23. The one or more non-transitory computer-readable media recited in claim 19, wherein the control data for each of non-identical circuit blocks in the plurality of circuit blocks comprise mask control bits for the compactor in the each of non-identical circuit blocks in the plurality of circuit blocks.

\* \* \* \* \*